United States Patent [19]
Wang et al.

[11] Patent Number: 5,727,014
[45] Date of Patent: Mar. 10, 1998

[54] VERTICAL-CAVITY SURFACE-EMITTING LASER GENERATING LIGHT WITH A DEFINED DIRECTION OF POLARIZATION

[75] Inventors: Shih-Yuan Wang, Palo Alto; Michael R. T. Tan, Menlo Park; William D. Holland, Mountain View; John P. Ertel, Portola Valley; Scott W. Corzine, Sunnyvale, all of Calif.

[73] Assignee: Hewlett-Packard Company, Palo Alto, Calif.

[21] Appl. No.: 551,302

[22] Filed: Oct. 31, 1995

[51] Int. Cl.$^6$ .................................................. H01S 3/19
[52] U.S. Cl. ........................... 372/96; 372/19; 372/108
[58] Field of Search ........................... 372/96, 26, 19, 372/108

[56] References Cited

U.S. PATENT DOCUMENTS

| | | | |
|---|---|---|---|
| 4,474,422 | 10/1984 | Kitamura | 350/6.8 |
| 5,416,044 | 5/1995 | Chino et al. | 437/129 |

FOREIGN PATENT DOCUMENTS

| | | | |
|---|---|---|---|
| 0544002A1 | 6/1993 | European Pat. Off. | G03G 15/04 |
| 0 709 939A | 5/1996 | United Kingdom | H01S 3/085 |

OTHER PUBLICATIONS

T. Wipiejewski et al., "Characterization of Two-Sided Output Veritcal-Cavity Laser Diodes by External Optical Feedback Modulation", Proceedings of the Lasers and Electro-Optics Society Annual Meeting, San Jose, California, Nov. 15-18 1993, pp. 564-565.

Kent D. Choquette et al., "Control of Vertical-Cavity Laser Polarization with Anisotropic Transverse Cavity Geometries", IEEE Photonics Technology Letters, vol. 6, No. 1, 1 Jan. 1994, pp. 40-42.

T. Mukaihara et al., "Engineered Polarization Control of GaAS/AlGaAs Surface-Emitting Lsers by Anisotropic Stress from Elliptical Etched Substrate Hole", IEEE Photonics Technology Letters, vol. 5, No. 2, Feb. 1993, pp. 133-135.

T. Yoshikawa et al., "Complete Polarization Control of 8X8 Vertical-Cavity Surface-Emitting Laser Matrix Arrays", Applied Physics Letters, vol. 66, No. 8, Feb. 20, 1995, pp. 908-910.

*Primary Examiner*—Brian Healy
*Assistant Examiner*—Yisun Song
*Attorney, Agent, or Firm*—Ian Hardcastle

[57] ABSTRACT

A vertical-cavity surface-emitting laser that generates light having a fixed direction of polarization. The laser has a plane light-generating region sandwiched between a first conductive mirror region and a second conductive mirror region. The first conductive mirror region has an opposite conductivity mode from the second conductive mirror region. The first conductive mirror region has a remote surface substantially parallel to the light-generating region and an electrode formed on the remote surface. The electrode bounds a light emission port from which the light is emitted in a direction defining an axis. A reduced-conductivity region is formed in the first conductive mirror region surrounding the axis and extending from the remote surface towards the light-emitting region to define a core region in the first conductive mirror region. The light emission port and/or the core region has first and second dimensions in orthogonal directions in a plane parallel to the light-generating region. The first dimension is greater than the second dimension to set the direction of polarization of the light to the direction of the first dimension.

25 Claims, 8 Drawing Sheets

VERTICAL-CAVITY SURFACE-EMITTING LASER GENERATING LIGHT WITH A DEFINED DIRECTION OF POLARIZATION

FIELD OF THE INVENTION

The invention relates to semiconductor lasers, in particular to vertical-cavity surface-emitting lasers that generate light with a defined direction of polarization, to arrays of such lasers, and to optical scanning systems and optical communication systems employing such lasers.

BACKGROUND OF THE INVENTION

The optical arrangement of a typical laser printer 11 is shown in FIG. 1. In this, the light beam 12 from the single laser 13 is imaged onto the surface of the photo conductive drum 15 via the rotating polygon mirror 17. The rotating polygon mirror 17 constitutes the scanner 22 that angularly deflects the light beam 12 to generate the scanning beam 16 that scans the curved surface 21 of the photo conductive drum 15 along the scan line 19. The photo conductive drum is positioned relative to the scanner so that the scan line 19 is substantially parallel to the axis of rotation 23 of the drum. Normally, the scanner 22 additionally includes the pair of fθ lenses 27 interposed between the polygon mirror 17 and the photo conductive drum 15 to flatten the field of curvature of the scan line 19 and to provide a constant scan velocity along the scan line.

The photo conductive drum 15 and the polygon mirror 17 both rotate so that the curved surface 21 of the photo conductive drum is covered by successive scan lines 19. The time required to scan the entire curved surface of the photo conductive drum, which determines the printing speed of the printer, depends on the spacing between adjacent scan lines (which is inversely proportional to the printer resolution), the number of facets on the polygon mirror and the rate of rotation of the polygon mirror.

The scanner 22 also includes the collimating lens 25 interposed between the laser 13 and the polygon mirror 17 to collimate the light beam from the laser. The scanner 22 may also include additional lenses, such as the lens 29, to mitigate the effect of the facets of the polygon mirror not being exactly parallel to the axis of rotation.

An optical arrangement (without the photo conductive drum) similar to that just described is used in certain types of optical scanners and in other optical scanning applications.

Trends in laser printers towards greater print resolution (for example, from 12 dots per mm. (300 dots per inch (dpi)) to 24 dots per mm. (600 dpi)), greater print speed (i.e., a greater number of pages printed per minute), and smaller printer size has pushed the performance of the rotating polygon mirror scanner close to its practical limits. Mirror rotational speeds greater than about 20,000 rpm give rise to stability problems. Increasing the number of facets on the polygon mirror requires an increased optical path length to compensate for the smaller deflection angle of each facet, and requires more complex lenses, which are expensive to make.

U.S. Pat. No. 4,474,422 of Kitamura discloses the use of an array of lasers in lieu of the single laser 13. Kitamura's array increases the rate at which a given scanner can write scan lines 19 on the curved surface 21 of the photo conductive drum by a factor proportional to the number of lasers in the array, since the light beam from each laser in the array writes one line on the drum on each scan of the drum.

However, the laser array disclosed by Kitamura employs edge-emitting lasers, which have a number of disadvantages that result in inadequate performance in this application. These disadvantages include thermal and electrical crosstalk between adjacent lasers, poor coupling efficiency of the light from the lasers into the printer optical system, optical interference between adjacent light beams, a lack of uniformity between the lasers in the array, which results in banding on the printed page, and low yields in mass production, which makes such laser arrays costly.

Recently, vertical-cavity surface-emitting lasers (VCSELs) have been introduced. Such lasers emit light from a plane surface parallel to the substrate of the device instead of from a very narrow region about 0.1 μm wide on the cleaved edge of the device. This enables plural VCSELs to be positioned on a common substrate in an array in which adjacent lasers are sufficiently distant from one another to prevent electrical and thermal crosstalk and inter-beam interference, but appear in abutment on the scan axis. Moreover a VCSEL inherently has a smaller numeric aperture and generates a much more symmetrical light beam than an edge-emitting laser. As a result, the light generated by the VCSEL is coupled into the printer optical system more efficiently than the light generated by the edge-emitting laser. The increased coupling efficiency enables the VCSEL to run at lower power to produce a given light intensity at the photo conductive drum, which further reduces electrical and thermal crosstalk problems.

However, the width of the lines printed by a laser printer employing a single VCSEL or an array of VCSELs can vary depending on the position of the line on the scan line. The line width of lines near the edges of the scan line can be less than that of lines near the center of the scan line. In other words, the line width of lines printed near the edges of the paper can be less than that of lines printed near the center of the paper. When they occur, these line width variations degrade the perceived print quality of the printer. Moreover, the extent of the line width variations can change in the course of printing a single page, and may not occur at all in some pages. These line width variations result from variations in the intensity of the light falling on the surface of the photo conductive drum. These variations in intensity are the result of random changes in the direction of polarization of the light generated by the VCSEL.

The light generated by a VCSEL is highly polarized, but the direction of polarization is not fixed. The direction of polarization can change randomly, either spontaneously or in response to an external stimulus, such as light reflected back into the VCSEL from the printer optical system. The variations in the direction of polarization cause the line width variations primarily because the scanner 22 has a transfer function between the light beam 12 and the scanning beam 16 that depends on the direction of polarization of the light beam 12. In particular, the polygon mirror 17 has a reflectivity that varies according to the angle of incidence by an amount that depends on the direction of polarization of the light from the VCSEL. An additional source of the intensity variation is the fθ lens, which, because its surfaces have a reflectivity that depends on the angle of incidence, has an effective transmissivity that varies according to the angle of incidence by an amount that depends on the direction of polarization of the light from the VCSEL. The angle of incidence-dependent reflectivity of the elements of the scanner 22 varying according to the direction of polarization of the light from the VCSEL causes the intensity of the light falling on the curved surface 21 of the photo conductive drum 15 to change depending on the angle of incidence by an amount that depends on the randomly-varying direction of polarization of the light from the VCSEL.

The scanning beam 16 falling on the photo conductive drum 15 has a substantially gaussian intensity distribution across its width. Each point on the surface 21 of the photo conductive drum must absorb a threshold amount of energy from the scanning beam to become discharged. Thus, the size of the spot 24 on the surface of the photo conductive drum that is discharged by the scanning beam (and, hence, the width of the printed line) depends on the intensity of the scanning beam. The intensity of the scanning beam depends on the optical transfer function of the scanner 22, which varies depending on the angle of incidence relative to the elements of the scanner by an amount that depends on the direction of polarization of the light beam 12, as described above. To solve this problem, a VCSEL array that generates light with a defined direction of polarization is required. Such a VCSEL array can then be aligned in the printer optical system to generate light with a direction of polarization corresponding to that which minimizes the angle of incidence-dependent variation in the reflectivity of the elements of the printer optical system.

The greater optical coupling efficiency of a VCSEL compared with an edge-emitting semiconductor laser is also advantageous in optical communication links. Such communication links often use a reflection-dependent beam splitter to control the light output of the VCSEL at the transmitter. Random variations in the direction of polarization of the light from the VCSEL reduce the effectiveness of such reflection-dependent light output control systems because the light level entering the sensor depends on the reflectivity of the beam splitter, which, in turn, depends on the direction of polarization of the light generated by the VCSEL. The direction of polarization-dependent reflectivity variations are sufficient to mask variations in the light output of the VCSEL. Thus, a VCSEL capable of generating light with a defined direction of polarization is also required to solve the problem of random intensity variations in the feedback systems of optical communication links.

A VCSEL array in which the VCSELs generate light with a defined direction of polarization is described by Yoshikawa et al. in *Complete Polarization Control of an 8×8 Vertical-Cavity Surface-Emitting Laser Matrix Arrays* (66 APPL. PHYS. LETT. (8), 908–910 (Febuary 1995)). The VCSELs are fabricated by selectively etching the upper distributed Bragg reflector (DBR) in each VCSEL to form a post having a rectangular cross section in a plane perpendicular to the direction of emission.

The VCSEL structure disclosed by Yoshikawa et al. does not offer an ideal solution to the problems set forth above for a number of reasons. First, the process of selectively etching the upper DBR to form a rectangular post is difficult to perform, and leaves the edges of the layers of the DBR exposed to possible contamination. Second, the VCSEL structure emits light through the substrate, which precludes their use in most laser printers, because most printer optical systems are designed to operate in the wavelength range of 700–900 nm. The substrate of the VCSEL absorbs light in this wavelength range. Thus, using the VCSEL array disclosed by Yoshikawa et al. would require most printer optical systems to be redesigned to operate at wavelengths at which the substrate does not absorb light.

Accordingly, a VCSEL structure is required that generates light with a defined direction of polarization corresponding to the direction of polarization that minimizes the variation in the angle of incidence-dependent reflectivity of the elements of the printer optical system, that is easily fabricated, and that is capable of generating light at a wavelength in the range for which most printer optical systems are designed.

SUMMARY OF THE INVENTION

The invention provides a vertical-cavity surface-emitting laser that generates light having a fixed direction of polarization. The laser comprises a plane light-generating region sandwiched between a first conductive mirror region and a second conductive mirror region. The first conductive mirror region has an opposite conductivity mode from the second conductive mirror region. The first conductive mirror region includes a remote surface substantially parallel to the light-generating region and an electrode formed on the remote surface. The electrode includes a light emission port from which the light is emitted in a direction defining an axis. The first conductive mirror region also includes a reduced-conductivity region surrounding the axis and extending from the remote surface towards the light-emitting region to define a core region in the first conductive mirror region. The light emission port and/or the core region has first and second dimensions in orthogonal directions in a plane parallel to the light-generating region. The first dimension is greater than the second dimension to set the direction of polarization of the light to the direction of the first dimension.

The light emission port and/or the core region may be substantially elliptical, rectangular, polygonal or another asymmetrical shape in the plane parallel to the light-generating region.

The second conductive mirror region of the laser may be doped with p-type impurities, and the laser may additionally comprise a substrate having a surface on which the second conductive mirror region is formed. The substrate may comprise n-type GaAs, a degenerately-doped p-type layer adjacent the surface, and a degenerately-doped n-type layer adjacent the p-type layer, with the degenerately-doped layers constituting a tunnel junction.

The laser may be one of an array of substantially identical lasers each emitting a light beam having a substantially identical direction of polarization. The array of substantially identical lasers is formed in a common layered structure. Each laser in the array includes an individual electrode. The reduced-conductivity region each laser in the array functions to isolate the laser from the adjacent lasers in the array.

The invention also provides a scanning apparatus providing a uniform level of illumination along a scanning line. The scanning apparatus comprises a vertical-cavity surface-emitting laser emitting a light beam having a defined direction of polarization, and a scanner that angularly deflects the light beam in a repetitive cycle to generate a scanning beam. The scanner has a transfer function between the light beam and the scanning beam that varies according to the direction of polarization of the light beam.

The laser is structured as described above and is aligned relative to the scanner such that the direction of polarization of the light beam falling on the scanner is in a range in which the variation of the transfer function of the scanner is below a threshold value.

The laser may be one of an array of substantially identical lasers each emitting a light beam having a substantially identical direction of polarization. The array of substantially identical lasers is formed in a common layered structure, each laser in the array includes an individual electrode, and the reduced-conductivity region of each laser in the array functions to isolate the laser from adjacent lasers of the array.

The scanning apparatus may additionally include a photo conductive drum positioned to be scanned by the scanning beam.

Finally, the invention provides an optical transmitter apparatus that generates a light beam having a controlled intensity for feeding into an optical communication system. The optical transmitter apparatus comprises a vertical-cavity surface-emitting laser emitting the light beam with a defined direction of polarization, an arrangement that couples the light beam into the optical communication system, and a feedback system that controls the intensity of the light beam. The feedback system includes a sampling element that derives a sample beam from the light beam. The sampling element has a transfer function between the light beam and the sampling beam that varies according to the direction of polarization of the light beam. The laser is structured as described above.

DETAILED DESCRIPTION OF THE INVENTION

Figure 2A:
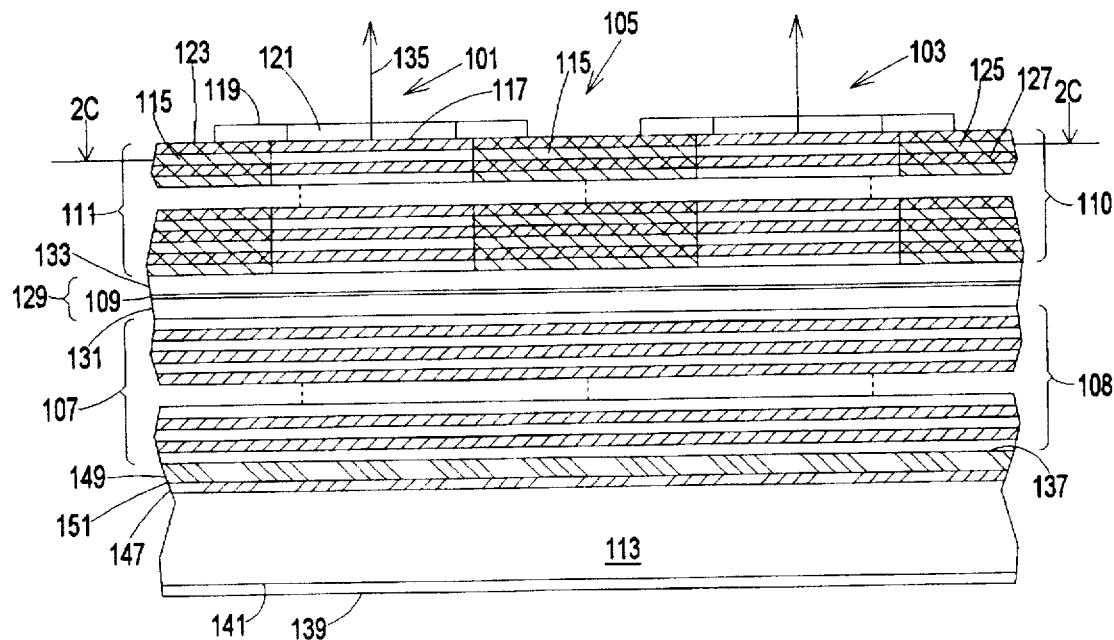
FIG. 2A is a cross sectional view of two VCSELs according to the invention forming part of a VCSEL array according to the invention.
Figure 2B:
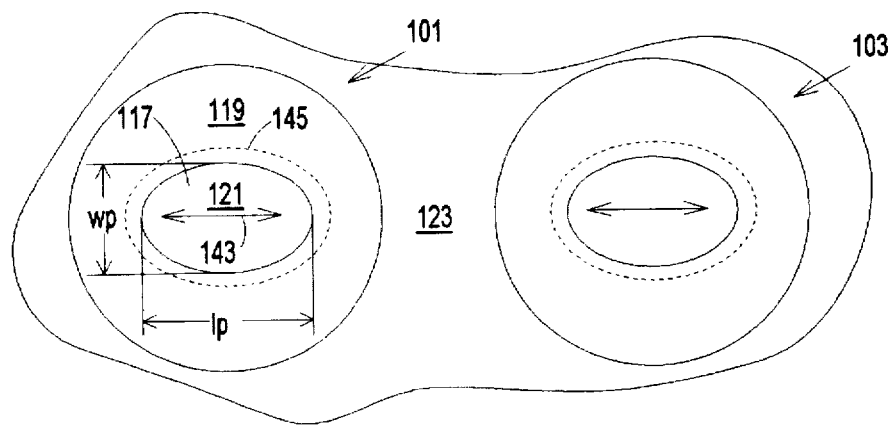
FIG. 2B is a view of the two VCSELs according to the invention showing the upper surface of the upper conductive mirror region.
Figure 2C:
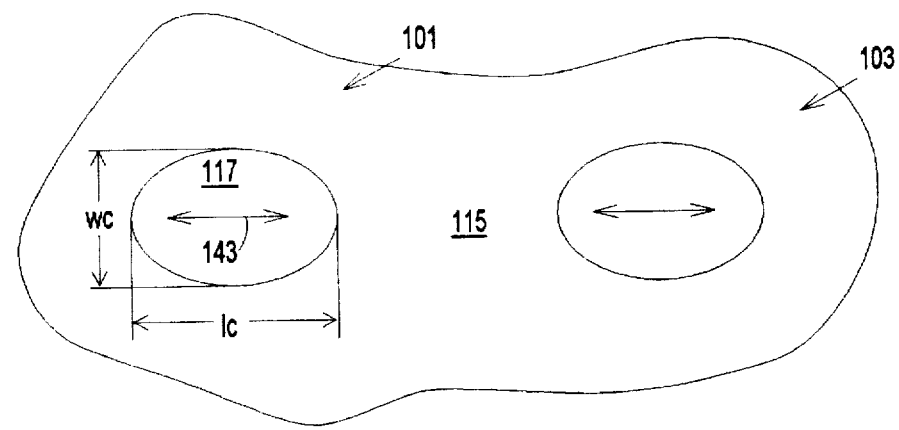
FIG. 2C is a cross sectional view of the upper conductive mirror region of the two VCSELs according to the invention in a plane perpendicular to the plane of FIG. 2A.

Two VCSELs 101 and 103 according to the present invention, forming part of the VCSEL array 105, are shown in FIGS. 2A–2C. The VCSELs 101 and 103 according to the invention each include the lower conductive mirror region 108, the light-generating region 109, and the upper conductive mirror region 110 sequentially formed on the substrate 113. The upper and lower conductive mirror regions have opposite conductivity modes.

The electrode 119, which includes the light emission port 121, is deposited on the upper surface 123 of the upper conductive mirror region 110, remote from the light-generating region 109. The reduced-conductivity region 115 is formed in the upper conductive mirror region 110 to define the core region 117. The core region extends towards the light-generating region 109 from the part of the upper surface 123 under the electrode 119. The reduced-conductivity region 115 confines current flowing towards the light-generating region 109 from the electrode 119 to the core region 117.

In response to current flowing via the electrode 119, the VCSEL 101 according to the invention emits light from the light emission port 121 in the electrode. The light emitted by the VCSEL 101 has a direction of polarization defined by making the light emission port 121 in the electrode 119 and/or the cross section of the core region 117 bounded by the reduced-conductivity region 115 in the upper conductive mirror region 110 asymmetrical. The light emission port and/or the core region have a different dimensions in two orthogonal directions in a plane parallel to the light generating region 109. The greater of these dimensions defines the direction of polarization.

Defining the direction of polarization of the light emitted by the VCSEL 101 by making the light emission port 121 and/or the cross section of the core region 117 defined by the reduced-conductivity region 115 asymmetrical avoids the need for a complex selective etching process to define a rectangular post, and does not leave the edges of the upper conductive mirror region 111 exposed to possible contamination. Moreover, by emitting the light from the light emission port 121 in the electrode 119 deposited on the upper surface 123 of the VCSEL, remote from the substrate 113, the VCSEL according to the invention can not only generate light with a defined direction of polarization but can also generate such light in the wavelength range for which most printer optical systems are designed. This eliminates the need to redesign the printer optical system. Thus, the invention provides an easy-to-fabricate VCSEL structure that generates light with a defined direction of polarization which enables the performance advantages of a VCSEL to be obtained without the print quality shortcomings of known VCSELs that generate light lacking a defined direction of polarization.

FIGS. 2A, 2B, and 2C show the thin-film vertical-cavity surface-emitting lasers (VCSELs) 101 and 103 that form part of the VCSEL array 105. These figures respectively show a first cross sectional view in a plane perpendicular to the plane of the light-generating region 109, a top view, and a second cross sectional view in a plane parallel to the light-generating region. It should be noted that FIGS. 2A–2C do not show the VCSELs 101 and 103 to scale. In particular, the distributed Bragg reflectors 107 and 111 respectively constituting the upper and lower conductive mirror regions 108 and 110, and the light-generating region 109 have been expanded to provide clarity in the drawings.

In practice, the thickness of the substrate 113 is approximately 150 μm, while the combined thickness of the distributed Bragg reflectors 107 and 111 and the light-generating region 109 is about 6–7 μm. The length of the major axis of the light emission port 121 in the electrode 119 is approximately 10 μm. Moreover, since each of the distributed Bragg reflectors 107 and 111 typically includes tens of layers, most of the layers have been omitted from the each of the distributed Bragg reflectors shown in the drawings for the sake of simplicity. Finally, the terms "upper" and "lower" are respectively used in this description to denote remoteness or proximity of various elements relative to the substrate 113, and not to indicate any particular spatial orientation.

The VCSEL 101 will be described in detail. The VCSEL 103 is structurally similar, and so will not be described in detail. The VCSEL 101 is designed to emit light at a wavelength of λ. In the VCSEL 101, the light-generating region 109 is sandwiched between the upper and lower conductive mirror regions 108 and 110. One of the upper and lower conductive mirror regions 108 and 110 is doped with p-type impurities, and the other of them is doped with n-type impurities so that the conductive mirror regions 108 and 110 and the light-generating region 109 collectively form a n-i-p diode. More details of the doping of the conductive mirror regions and the substrate 113 are set forth below.

The upper and lower conductive mirror regions 108 and 110 are preferably constituted by the distributed Bragg reflectors 107 and 111, respectively. The distributed Bragg reflectors 107 and 111 have a periodic structure of thin semiconductor or dielectric layers, for example, the layers 125 and 127, with alternating higher and lower refractive indices. Each of the layers of the distributed Bragg reflectors has a physical thickness of $\lambda/4n_1$, where $n_1$ is the refractive index of the layer.

The light-generating region 109 is deposited central to the optical cavity 129 that has a physical thickness equal to an integral multiple of $\lambda/2n_2$, where $n_2$ is the average refractive index of the optical cavity. The optical cavity 129 is constructed from two cladding layers 131 and 133 of a material that has a refractive index that is either greater than or less than the adjacent layers of the distributed Bragg reflectors 107 and 111. For example, the light-generating region 109 may be formed of alternating GaAs barrier layers and $In_{.2}Ga_{.8}As$ layers (not shown) constituting quantum well structures, and the cladding layers 131 and 133 may be layers of AlGaAs. Each of the cladding layers is doped to have the same conductivity mode as the adjacent distributed Bragg reflector.

The layers, e.g. 125 and 127, of the distributed Bragg reflectors 107 and 111 reflect most of the light generated by the light-generating region 109 back into the optical cavity 129. Wave interference within the layers of the distributed Bragg reflectors reduces the light to standing waves of wavelength λ. By making the distributed Bragg reflectors 107 and 111 somewhat less than totally reflective, coherent light having a wavelength of λ is emitted in the direction perpendicular to the plane of the optical layers, as indicated by the arrow 135. By properly selecting the layer materials and thicknesses, light emission by the VCSEL 101 can be reduced to a single longitudinal mode.

The entire structure of the VCSEL array 105 is deposited as a succession of layers on the surface 137 of the substrate 113. The metal electrode 139 is deposited on the surface 141 of the substrate, remote from the surface 137.

The just-described layer structure of the VCSEL array 105 is divided into the individual VCSELs, such as the VCSELs 101 and 103, by forming the reduced-conductivity region 115 in the upper distributed Bragg reflector 111 to define the core region for each VCSEL, for example, the core region 117 of the VCSEL 101. The reduced-conductivity region 115 is formed in the upper distributed Bragg reflector 111 by ion bombardment, preferably performed using hydrogen ions. Ions of other suitable elements, such as helium or oxygen, may alternatively be used. As a further alternative, the reduced conductivity region may be defined by forming a native oxide region in at least one of the layers of the upper distributed Bragg reflector 111. The reduced-conductivity region 115 confines the current passing through the VCSEL 101, and hence the region in which light is generated, to the core region 117.

The reduced-conductivity region 115 is shaped in the vicinity of each of the VCSELs in the VCSEL array 105 to provide the core region (for example, the core region 117) with an elongate cross section in a plane parallel to the plane of the light-generating region 109. The cross section of the core region in this plane is elongated in the direction of the desired direction of polarization 143 of the light. Thus, in the plane parallel to the plane of the light-generating region, the dimension lc of the core region 117 in the direction of polarization 143 is greater than the dimension wc of the core region in the direction orthogonal to the direction of the dimension lc and to the direction of polarization. This is shown in FIG. 2C, which is a cross-sectional view of the upper distributed Bragg reflector 111. The boundary of the core region 117 is also indicated by the dotted line 145 in FIG. 2B.

A metal electrode is deposited on the upper surface 123 of the upper distributed Bragg reflector 111 of each of the VCSELs in the VCSEL array 105. The upper surface 123 is the surface of the upper distributed Bragg reflector 111 remote from the light-generating region 109. For example, in the VCSEL 101, the electrode 119 is formed on the upper surface 123 of the distributed Bragg reflector 111. The electrode 119 is located on the upper surface 123 so that it is substantially coaxial with the core region 117. The electrode 119 is formed to include the elongate light emission port 121 through which the light generated by the VCSEL is emitted. Similar to the cross section of the core region 117, the light emission port 121 formed in the electrode 119 is elongate in the direction in the desired direction of polarization 143 of the light. Thus, the dimension lp of the light emission port 121 in the direction of polarization 143 is greater than the dimension wp in the direction orthogonal to the direction of the dimension lc and to the direction of polarization.

Most of the electrode 119 is formed on the reduced-conductivity region 115 surrounding the core region 117 of the VCSEL 101. However part of the electrode overlaps the core region 117. Thus, current from a current source (not shown) flows via the electrode 119 into the core region 117, and is confined to the core region by the reduced-conductivity region 115. As a result, photon generation is also confined to a region corresponding to the core region 117. The current flowing through the VCSEL 101 via the electrodes 119 and 139 stimulates the VCSEL 101 to lase and to generate light with a direction of polarization defined by the asymmetry of either or both the core region 117 and the light emission port 121.

In an exemplary VCSEL structure, 32.5 pairs of alternating AlGaAs and AlAs layers are epitaxially grown by molecular beam epitaxy on the substrate 113 to form the lower distributed Bragg reflector 107. The cladding layer 131 is next deposited, followed by the light-generating layer 109 and the cladding layer 133. Next, 20 pairs of AlGaAs and AlAs layers are deposited to form the upper Bragg reflector 111. In the distributed Bragg reflectors, the alternating AlGaAs and AlAs layers are constructed in a graded short period super lattice to reduce electrical resistance and band offset across the layer interfaces, as is known in the art. Alternatively, the distributed Bragg reflectors may be formed using alternating layers of AlAs and GaAs, or using layers of other suitable materials known in the art.

The electrode 119 is a metallized electrode of the appropriate type for the conductivity mode of the upper distributed Bragg reflector 111 and is deposited on the upper surface 123 of the upper distributed Bragg reflector 111. The electrode 139 is also a metallized electrode of the appropriate type for the conductivity mode of the substrate 113 and is placed on the back of the substrate 113. The substrate 113 is preferably n-type GaAs.

There are other ways to construct a vertical-cavity surface-emitting laser with an asymmetrical core and light emission port. Thus, the VCSELs according to the invention are not limited to using the particular construction just described.

Figure 3A:
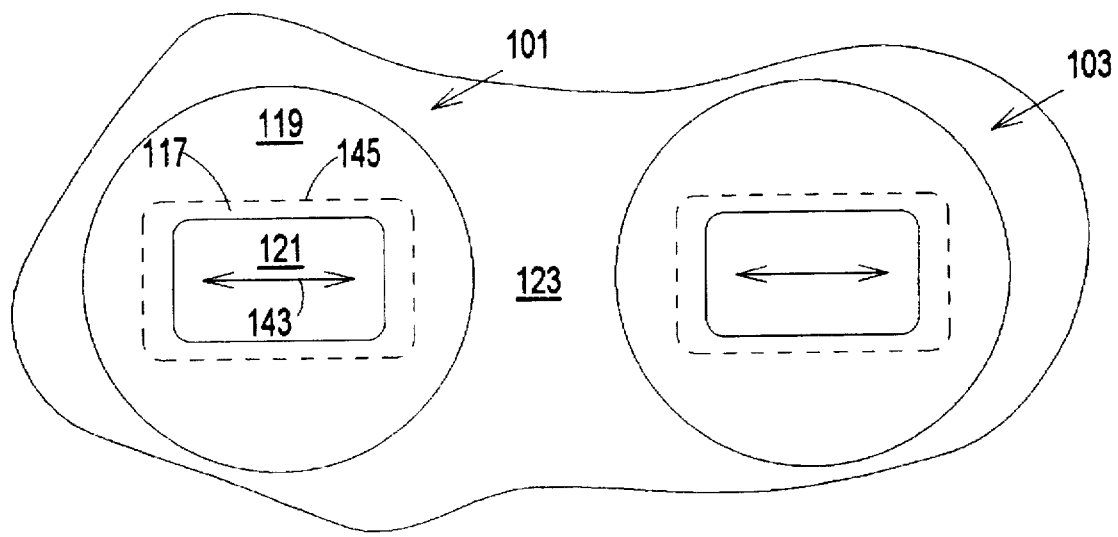
FIGS. 3A and 3B are views respectively corresponding to FIGS. 2B and 2C of an alternative embodiment of two VCSELs according to the invention forming part of a VCSEL array according to the invention.
Figure 3B:
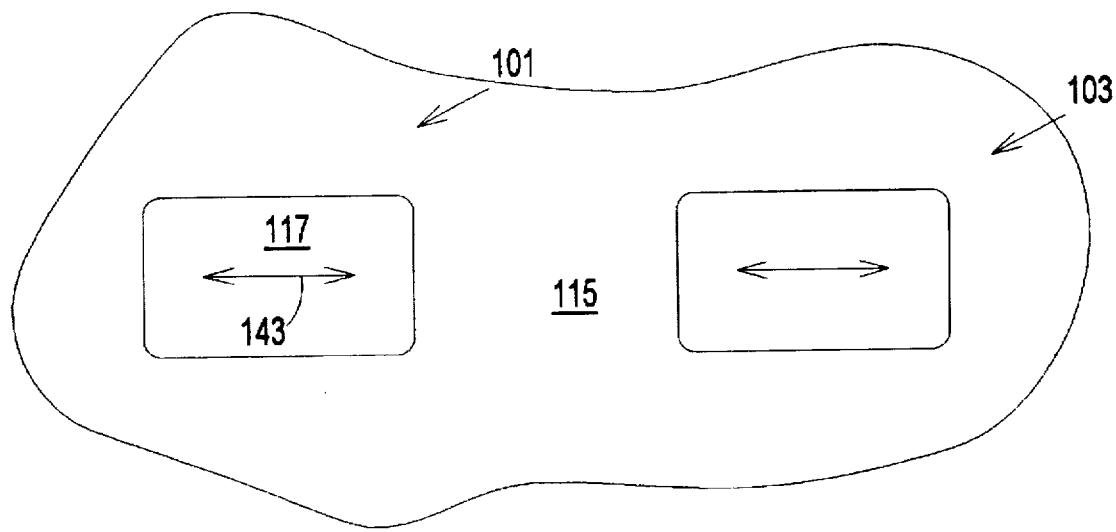
Figure 4A:
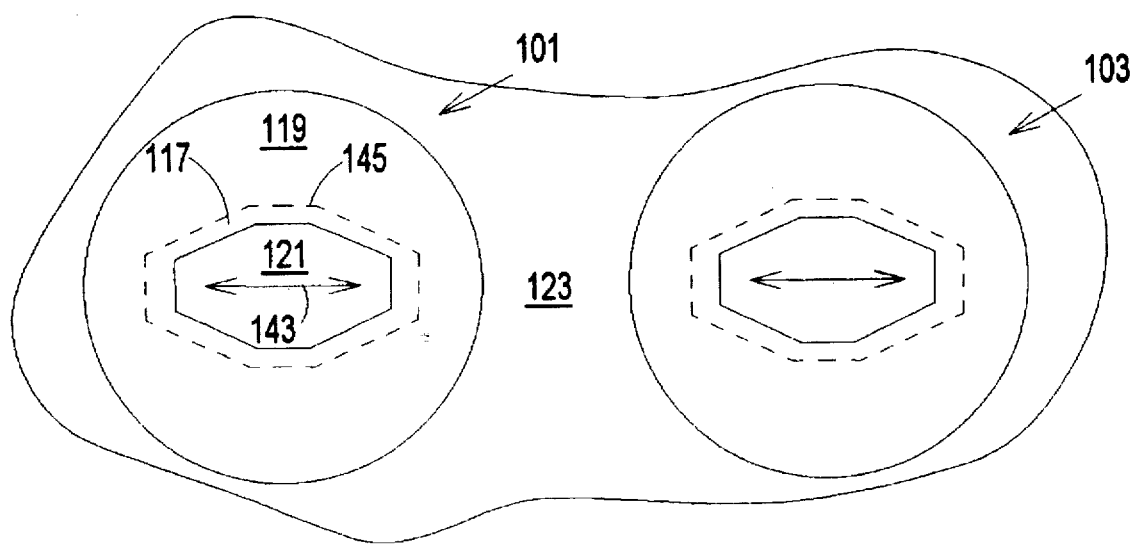
FIGS. 4A and 4B are views respectively corresponding to FIGS. 2B and 2C of another alternative embodiment of two VCSELs according to the invention forming part of a VCSEL array according to the invention.
Figure 4B:
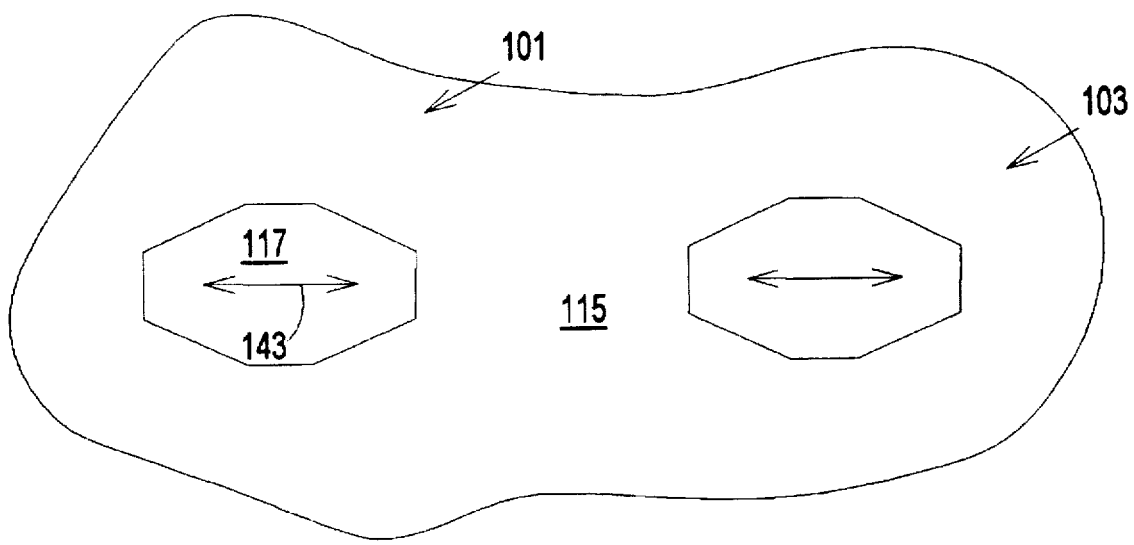

An elliptical light emission port 121 is shown in FIG. 2B. FIG. 2C shows the reduced conductivity region 115 shaped to define the core region 117 with an elliptical cross section in a plane parallel to the plane of the light-generating region 109. However, the light emitting port 121 and the cross section of the core region 117 can have other asymmetrical shapes. For example, the light emitting port 121 may be made rectangular, and the reduced-conductivity region 115 may be shaped to define the core region 117 with a rectangular cross section, as shown in FIGS. 3A and 3B. Alternatively, these elements may be made polygonal, as shown, for example, in FIGS. 4A and 4B, or some other suitable asymmetrical shape having different dimensions in two orthogonal directions.

The asymmetry of the light emission port 121 and of the cross section of the core region 117 depends on a trade-off between resistance to change of the direction of polarization and symmetry of the emitted light beam. Increasing the asymmetry of the light emission port 121 and of the cross section of the core region 117 reduces the possibility of the direction of polarization of the light beam changing spontaneously or in response to an external stimulus, such as light reflected back into the VCSEL 101 from the printer optical system. However, increasing the asymmetry of the light emission port and of the cross section of the core region also increases the asymmetry of the light beam generated by the VCSEL, which reduces the coupling efficiency between the light beam and the printer optical system. Although the direction of polarization will not change spontaneously when the width wp, of the light emission port is about 80% or less than its length lp and/or when the width wc of the core region is about 80% or less than its length lc, increasing the asymmetry to make the widths less than 80% of their respective lengths (for example, 60%) gives an increased margin of resistance to the direction of polarization changing in response to external stimuli at the expense of a small reduction in coupling efficiency. In some applications, the reduction in coupling efficiency becomes significant at an asymmetry in which the widths are less than about 30% of the respective lengths.

Figure 1:
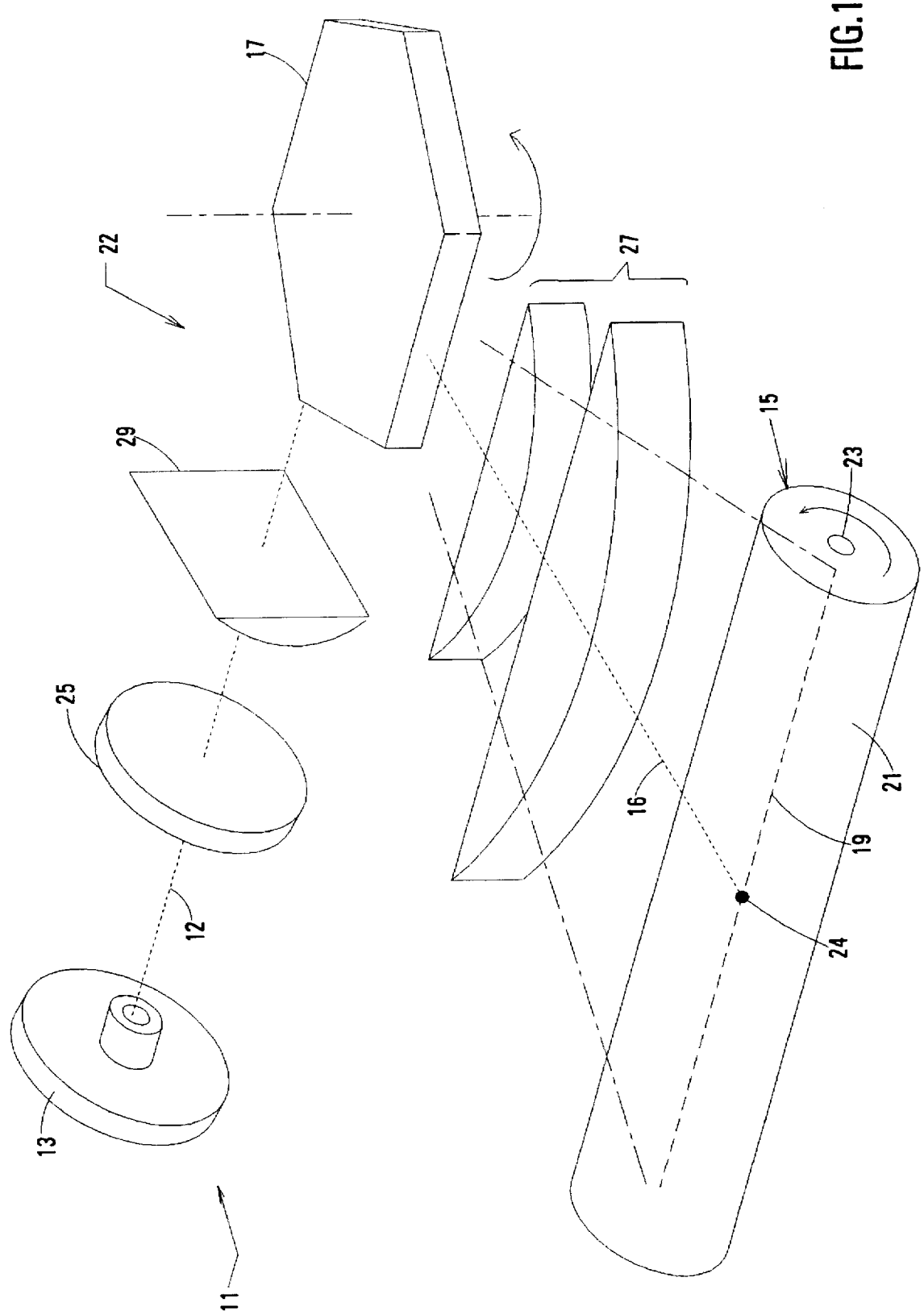
FIG. 1 shows the optical arrangement of a known laser printer.

When the asymmetry of the light emission port 121 and the cross section of the core region 117 are set at about 60%, the coupling efficiency of the polarization-defined VCSEL according to the invention is far greater than that of an edge-emitting laser, which generates a highly asymmetrical light beam. For example, a 20 mW (electrical) VCSEL will produce the about the same light intensity at the photo conductive drum 15 (FIG. 1) as an edge-emitting laser of about 100 mW. This substantial reduction in power (and current) enables acceptable levels of electrical and thermal cross talk to be obtained even when the VCSELs in the VCSEL array 105 according to the invention are spaced more closely than the elements of an edge-emitting array producing the same light intensity at the surface of the photo conductive drum. Reducing the spacing between the VCSELs in the VCSEL array increases the number of elements that can be accommodated in the array before the complexity of the printer optical system has to be increased to compensate for some of the VCSELs in the VCSEL array being off axis. With present 20 mW (electrical) VCSELs, cross talk and interference is acceptably low at spacings as close as 90 μm. Producing the same intensity at the photo conductive drum with VCSELs having an input power of 10 mW (electrical) is foreseeable, in which case, a spacing as close as 50 μm is possible. This would enable a 1×8 linear array to be made small enough to be used with existing printer optical systems.

Figure 5A:
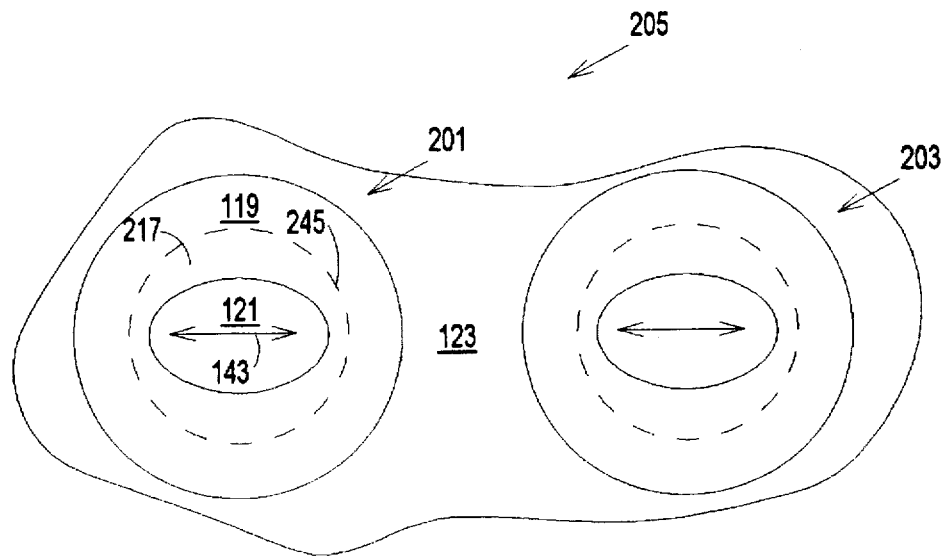
FIGS. 5A and 5B are views respectively corresponding to FIGS. 2B and 2C of another alternative embodiment of two VCSELs according to the invention forming part of a VCSEL array according to the invention. In this embodiment, the core region is symmetrical and only the light emission port is asymmetrical.
Figure 5B:
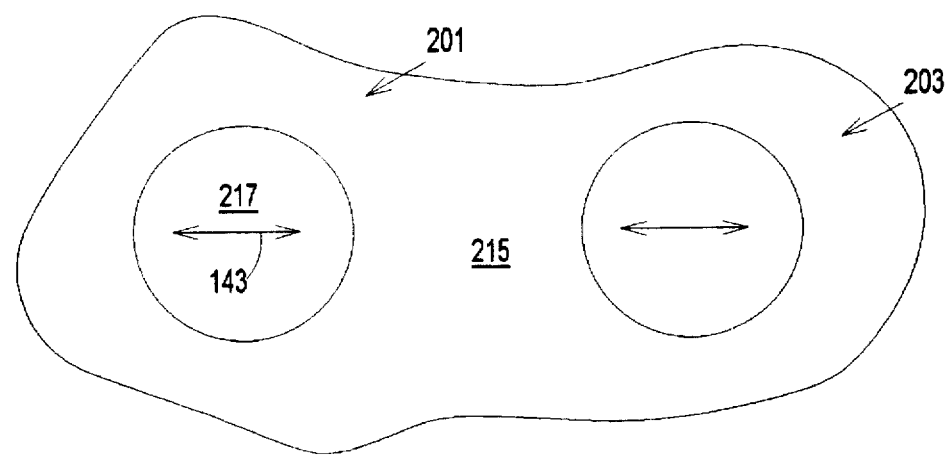
Figure 5C:
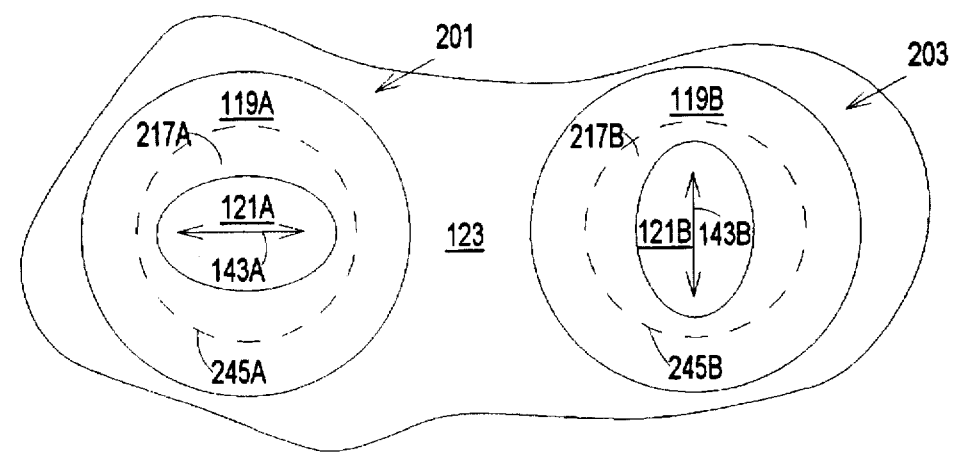
FIG. 5C is a view corresponding to FIG. 5A of another alternative embodiment of two VCSELs according to the invention forming part of a VCSEL array according to the invention. In this embodiment, the light emission ports of the two VCSELs are asymmetrical in different directions, and the light generated by the VCSELs has different directions of polarization.

In the further alternative shown in FIGS. 5A and 5B, the reduced-conductivity region 215 is shaped to define the core region 217 with a symmetrical cross section, and only the light emitting port 121 in the electrode 119 is made asymmetrical. This enables a common semiconductor structure to be used to make VCSEL arrays both with and without a defined direction of polarization and with different defined directions of polarization. Whether the light generated by each VCSEL in the array has a defined direction of polarization, and, if so, the direction of polarization, can then determined solely by the shape and orientations of the light emission port 121 in the electrode 119. The shape and orientation of the light emission port are defined in the metallization step in which the electrode 119 and the light emission port 121 are formed. This step is performed as one of the last steps of making the array. Moreover, in certain applications, some of the VCSELs in the VCSEL array 205 can be provided with symmetrical light emission ports and others can be provided with asymmetrical light emission ports, and the asymmetrical ports can have different orientations as shown in FIG. 5C, if required. In FIG. 5C, the VCSELs 201 and 203 are shown as generating light with orthogonal directions of polarization 243A and 243B.

Figure 6A:
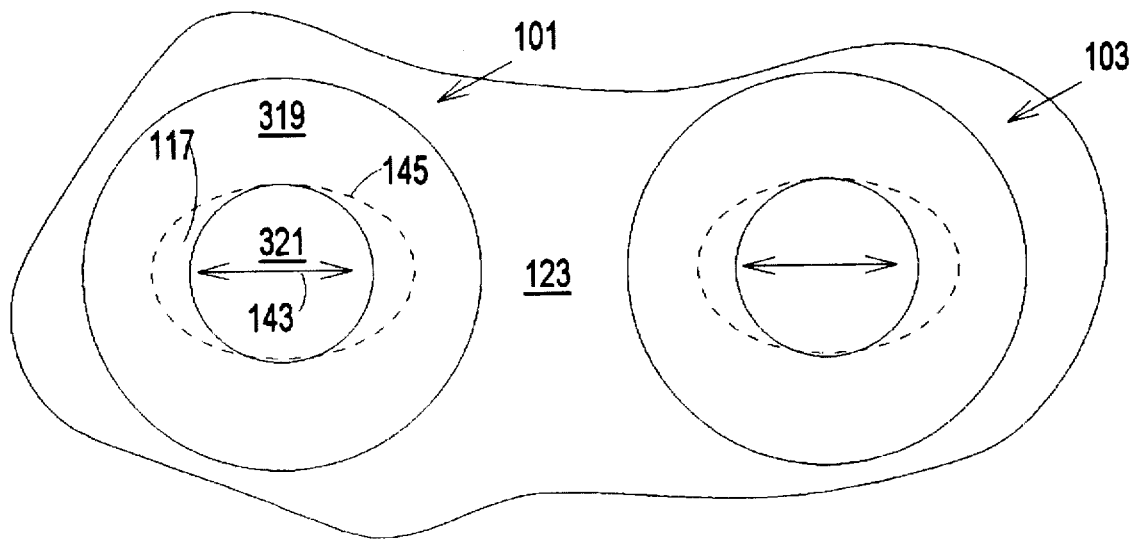
FIGS. 6A and 6B are views respectively corresponding to FIGS. 2B and 2C of another alternative embodiment of two VCSELs according to the invention forming part of a VCSEL array according to the invention. In this embodiment, the light emission port is symmetrical and only the core region is asymmetrical.
Figure 6B:
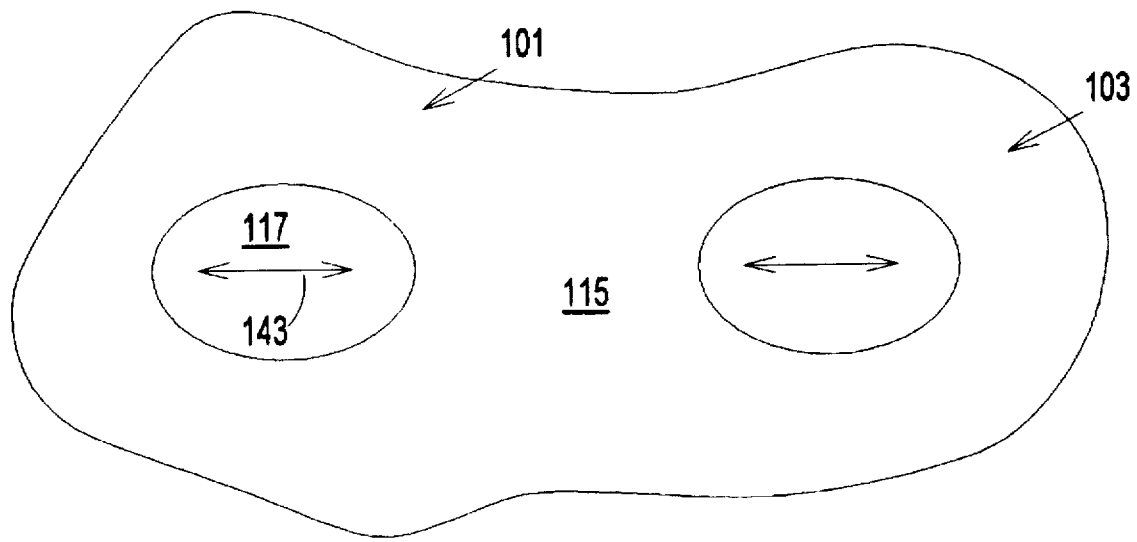

In a yet further alternative shown in FIGS. 6A and 6B, the reduced-conductivity region 115 is shaped to define the core region 117 with an asymmetrical cross section, but the light emitting port 321 is made symmetrical.

The light output of the laser in a high-resolution laser printer having a high printing speed must be capable of being rapidly modulated between a high output condition and a low output condition, just above threshold, by rapidly changing the current through the laser. Accordingly, the VCSELs in the preferred embodiment of the VCSEL array according to the invention have an n-drive, p-common structure that is easier to drive at high speed than a conventional p-drive, n-common structure. In the n-drive, p-common structure shown in FIG. 2A, the lower distributed Bragg reflector 107 and the lower cladding layer 131 are doped with p-type impurities, and the upper distributed Bragg reflector 111 and upper cladding layer 133 are doped with n-type impurities.

Practical difficulties prevent the use of p-type GaAs as the material of the substrate 113 on which to form the lower (p-type) distributed Bragg reflector 107. Thus, the lower distributed Bragg reflector must be grown on an n-type GaAs substrate. To prevent the reverse-biassed p-n junction between the lower distributed Bragg reflector 107 and the n-type substrate from blocking the flow of current from the VCSEL 101 to the electrode 139, the substrate 113 is very degenerately doped (preferably >$10^{21}$ atoms/cm$^3$) with n-type impurity in the layer 147 adjacent its surface, and the very degenerately doped (preferably >$10^{21}$ atoms/cm$^3$) p-type layer 149 is epitaxially grown on the n-type layer 147. The layer structure of the VCSEL array 105 is then grown on the surface 137 of the p-type layer 149 as described above. Additional details of this structure are described in U.S. patent application Ser. No. 08/330,033, the disclosure of which is incorporated herein by reference. A tunnel junction is formed at the boundary 151 between the very degenerately doped n-type layer 147 and the very degeneratively doped p-type layer 149. The current from the VCSEL 101 flows across this tunnel junction with a negligible voltage drop.

Alternatively, a VCSEL array can be made by doping of the lower and upper distributed Bragg reflectors 107 and 111 respectively with n-type and p-type impurities, and omitting the very degeneratively-doped layers 147 and 149. Such an array is more difficult to drive at high speed than the p-common, n-drive structure just described, however.

Although the VCSEL of the present invention has been described with respect to a VCSEL forming part of a VCSEL array, discrete VCSELs having the structural features of the present invention can be made for use in applications in which arrays are not required.

Figure 7:
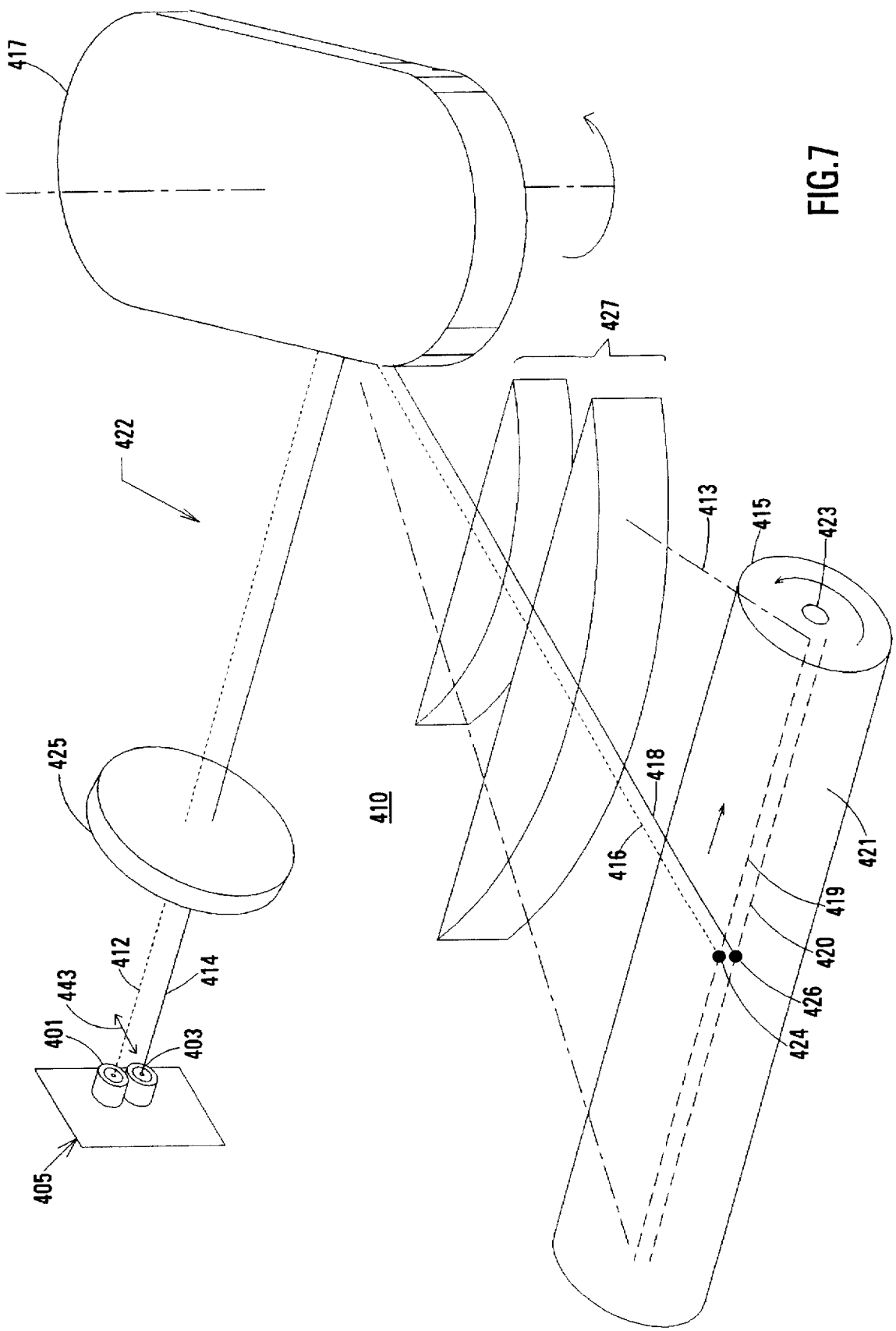
FIG. 7 shows the optical arrangement of a laser printer incorporating a scanner according to the invention using a VCSEL array with a defined direction of polarization according to the invention.

FIG. 7 shows an example of the application of a two-element VCSEL array according to the invention in a laser printer according to the invention. In the laser printer 410, the light beams 412 and 414 respectively generated by the VCSELs 401 and 403 forming the two-element VCSEL array 405 are imaged onto the surface of the photo conductive drum 415 via the rotating polygon mirror 417. The rotating polygon mirror 417 constitutes the scanner 422 that angularly deflects the light beams 412 and 414 from the respective VCSELs 401 and 403 to generate the respective scanning beams 416 and 418 that scan the curved surface 421 of the photo conductive drum 415 along the scan lines 419 and 420. The photo conductive drum is aligned relative to the scanner 422 so that the scan lines are substantially parallel to the axis of rotation 423 of the drum. Preferably, the scanner 422 additionally includes the pair of fθ lenses 427 interposed between the polygon mirror 417 and the photo conductive drum 415 to flatten the field of curvature of the scan lines 419 and 420, and to provide a constant scan velocity along the scan lines.

The photo conductive drum 415 and the polygon mirror 417 both rotate so that the curved surface 421 of the photo conductive drum is covered by successive pairs of scan lines 419 and 420. The time required to scan the entire curved surface of the photo conductive drum, which determines the printing speed of the printer, is approximately one half of that required conventionally, because the two scan lines 419 and 420 are written simultaneously each time the scanner 422 scans the photo conductive drum 415. Alternatively, the printing speed of the conventional printer can be maintained, and the cost of the printer reduced by halving the rotational speed of the polygon mirror 417, which allows the polygon mirror to use simpler beatings, or by halving the number of facets on the polygon mirror, which reduces problems due to non-parallel facets, or by some combination of these measures.

Also in the arrangement shown in FIG. 7, the collimating lens 425 is interposed between the VCSEL array 405 and the polygon mirror 417 to collimate the light beam from each of the VCSELs 401 and 403.

The VCSEL array 405 is aligned so that a line interconnecting the VCSELs 401 and 403 is perpendicular to the scanning plane 413. This orientation of the VCSEL array causes the light from the VCSELs 401 and 403 respectively to write the scan lines 419 and 420 in abutting, or slightly overlapping, locations on the curved surface 421 of the photo conductive drum 415.

The light emission port 121 and/or the core region 117 (FIG. 2A) of the VCSELs 401 and 403 in the VCSEL array 405 are preferably aligned such that the direction of polarization 443 of the light beams 412 and 414 falling on the elements of the scanner 422 is that which minimizes the variation in the direction of polarization-dependent transfer function of the scanner 422 between the light beams 412 and 414 and the respective scanning beams 416 and 418. As noted above, the direction of polarization-dependent transfer function of the scanner 422 is determined by the angle of incidence-dependent variation in the reflectivity of the polygon mirror 417 and in the effective transmissivity of the fθ lens 427. However, in practice, a less critical alignment of the VCSEL array 405 may be used, and the VCSEL array may be aligned so that the direction of polarization of the light beams 412 and 414 is in the range in which the variation of the transfer function of the scanner 422 is below a threshold value. In the laser printer 410, the threshold value is that at which the resulting variation in line width becomes noticeable.

In the preferred embodiment, the light emission port 121 and/or the core region 117 (FIG. 2A) of the VCSELs 401 and 403 in the VCSEL array 405 are aligned with their larger dimensions substantially parallel to the scanning plane 413. This orientation of the larger dimensions sets the direction of polarization 443 of the light generated by the VCSELs 401 and 403 parallel to the scanning plane 413. This orientation of the direction of polarization minimizes the variation of the transfer function of the scanner 422, and hence gives the most consistent line width along the length of the scan lines 419 and 420.

Alternatively, the light emission port 121 and/or the core region 117 (FIG. 2A) of the VCSELs 401 and 403 in the VCSEL array 405 may be aligned with their larger dimensions perpendicular to the scanning plane 413. This sets the direction of polarization 443 of the light generated by the VCSELs 401 and 403 perpendicular to the scanning plane 413. This orientation of the direction of polarization provides the scanner 422 with a greater transfer function variation than the parallel orientation discussed above, but which is still below the threshold value acceptable for most laser printer applications.

Aligning the light emission port 121 and/or the core region 117 (FIG. 2A) of the VCSELs 401 and 403 in the VCSEL array 405 with their larger dimensions at angles relative to the scanning plane 413 different from those specified above will result in line width variations. These line width variations will be consistent because the direction of polarization of the light beams 412 and 414 is now fixed. The probability of the line width variations being noticeable increases with increasing deviation of the orientation of the direction of polarization from the parallel and perpendicular orientations discussed above.

A VCSEL according to the invention would be used with a basic optical arrangement (without the photo conductive drum) similar to that shown in FIG. 7 in optical scanners and in other optical scanning applications. With the VCSEL delivering light with a defined direction of polarization, the intensity of the light scanning the object would remain substantially independent of the position along the scan line.

Figure 8:
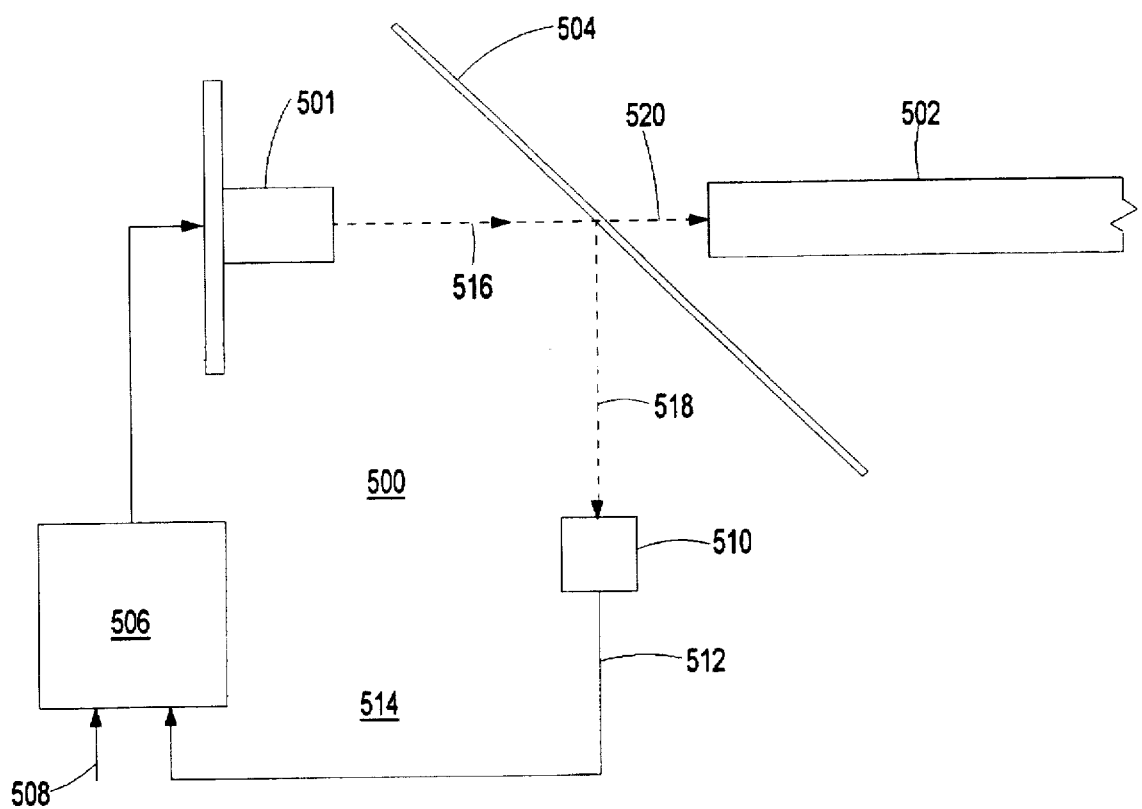
FIG. 8 shows an optical transmitter of an optical communication link according to the invention. The optical transmitter incorporates a VCSEL with a defined direction of polarization according to the invention.

FIG. 8 shows the optical transmitter 500 according to the invention of an optical communication link using the VCSEL 501 with a defined direction of polarization according to the invention. In FIG. 8, light from the VCSEL 501 is coupled to the optical fibre 502 via the beam splitter 504. The VCSEL 501 is electrically driven by the drive electronics 506 in accordance with the digital input signal 508.

The light generated by the VCSEL 501 is modulated between a high light condition and a low light condition in accordance with the states of the bits of digital input signal 508. The speed of the optical transmission link is maximized by making the difference between the high light condition and the low light condition relatively small. To ensure that a digitally-modulated optical signal with a relatively small intensity difference between the high light condition and the low light condition can be decoded accurately at the receiver, the optical transmitter 500 is equipped with the intensity control system 514. The intensity control system operates to maintain the light intensity at the input of the optical fibre 502 in at least one of the high light condition and the low light condition at a constant level.

In the intensity control system 514, the beam splitter 504 reflects a fraction (typically 10–20%) of the light beam 516 generated by the VCSEL 501 into the light sensor 510. The light sensor generates an electrical output 512 representative of the intensity of the light reflected by the beam splitter 504. The electrical output 512 is connected as a feedback signal to the drive electronics 506, where it is used to control the current driving the VCSEL 501, and hence, to control the intensity of the light beam 516 generated by the VCSEL in at least one of the high light and low light conditions. Thus, the intensity control system 514 just described operates to maintain a constant light intensity in at least one of the high light condition and the low light condition at the input to the optical fibre 502.

As noted above, the transfer functions of the beam splitter 504 between the light beam 516 generated by the VCSEL 501 and the reflected beam 518 and the transmitted beam 520 respectively reflected and transmitted by the beam splitter varies depending on the direction of polarization of the light beam 516 generated by the VCSEL. Thus, as a result of this variation, when a VCSEL generating light with an undefined direction of polarization is used in the optical transmitter 500, the intensity of the reflected beam 518 reflected by the beam splitter and falling on the light sensor 510, and the intensity of the transmitted beam 520 transmitted by the beam splitter and entering the optical fibre 502 vary in opposite directions according to the direction of polarization of the light beam 516.

The varying intensity of the reflected beam 518 falling on the light sensor 510 causes the feedback signal 512 to vary despite the intensity of the light beam 516 generated by the VCSEL remaining constant. The varying feedback signal in turn causes the drive electronics 506 to change the light output of the VCSEL unnecessarily. Moreover, the intensity of the light beam 516 generated by the VCSEL is changed in the wrong direction to maintain a constant light level at the input of the optical fibre 502. Thus, an undefined direction of polarization not only causes the light level entering the optical fibre to vary, but also causes the intensity control system 514 to exaggerate these variations.

In the optical transmitter 500 shown in FIG. 8, the VCSEL 501 is a VCSEL according to the invention, and has a defined direction of polarization. The light emission port 121 and/or the core region 117 (FIG. 2A) of the VCSEL 501 is preferably aligned such that the direction of polarization of the light beam 516 falling on the beam splitter is that which minimizes the variation in the direction of polarization-dependent transfer functions of the beam splitter 504 between the light beam 516 and the reflected beam 518 and the transmitted beam 520. However, in this embodiment, the alignment of the VCSEL 501 is much less critical than in the scanner embodiment described above because of the fixed angle of incidence of the light beam 516 generated by the VCSEL 501 and the beam splitter 504. Thus, while it is preferred to align the direction of polarization of the light beam 516 to minimize the variation in the transfer function of the beam splitter, any orientation of the direction of polarization of the light beam 516 will provide acceptable results.

Using the VCSEL 501 according to the invention to generate the light beam 516 with a defined direction of polarization maintains the transfer function of the beam splitter 504 constant in both reflection and transmission. As a result, intensity of the reflected beam 518 reflected by the beam splitter 504 and falling on the light sensor 510, and the intensity of the transmitted beam 520 transmitted by the beam splitter and entering the optical fibre 502 both have a constant relationship to the intensity of the light beam 516 generated by the VCSEL 501. Thus, any variation in the intensity of the reflected light beam 518 falling on the light sensor 510 is a result of a change in the intensity of the light beam 516 generated by the VCSEL 501, and the feedback circuit 512 can operate to change the current drive to the VCSEL 501 to maintain the intensity of the light beam 516 generated by the VCSEL 501 at its nominal value. Moreover, the VCSEL 501 generating the light beam 516 with a defined direction of polarization maintains the transfer function of the beam splitter 504 constant in transmission, the intensity control system 514 maintaining the intensity of the light beam generated by the VCSEL 501 at its nominal value also maintains the intensity of the transmitted light beam 520 falling on the light fibre 502 at its nominal value.

The VCSEL 501 according to the invention may also be employed with advantage in optical communication systems that do not use the intensity control system 514 just described but which incorporate elements that have a transfer function that depends on the direction of polarization of the light generated by the VCSEL. In such applications, the defined direction of polarization of the light generated by the VCSEL 501 provides a constant transfer function in the optical communication system.

Although this disclosure describes illustrative embodiments of the invention in detail, it is to be understood that the invention is not limited to the precise embodiments described, and that various modifications may be practiced within the scope of the invention defined by the appended claims.

We claim:

1. A vertical-cavity surface-emitting laser generating light having a fixed direction of polarization, the laser comprising:

a plane light-generating region sandwiched between a first conductive mirror region and a second conductive mirror region, the first conductive mirror region having an opposite conductivity mode from the second conductive mirror region, the second conductive mirror region being doped with p-type impurities, the first conductive mirror region including:

a remote surface substantially parallel to the light-generating region, an electrode formed on the remote surface, the electrode including a light emission port from which the light is emitted in a direction defining an axis, and a reduced-conductivity region surrounding the axis and extending from the remote surface towards the light-emitting region to define a core region in the first conductive mirror region, the core region having a first dimension and a second dimension in orthogonal directions in a plane parallel to the light-generating region, the first dimension being greater than the second dimension to set the direction of polarization of the light to the direction of the first dimension; and a substrate having a surface whereon the second conductive mirror region is formed, the substrate including n-type GaAs, a degenerately-doped p-type layer adjacent the surface, and a degenerately-doped n-type layer adjacent the p-type layer, the degenerately-doped layers constituting a tunnel junction.

2. The laser of claim 1, wherein the second dimension is less than 80% of the first dimension.

3. The laser of claim 1, wherein the second dimension is between 60% and 30% of the first dimension.

4. The laser of claim 1, wherein the core region is substantially elliptical in the plane parallel to the light-generating region.

5. The laser of claim 1, wherein the core region is substantially rectangular in the plane parallel to the light-generating region.

6. The laser of claim 1, wherein the core region is polygonal in the plane parallel to the light-generating region.

7. The laser of claim 1, wherein:

the light emission port has a third dimension and a fourth dimension in orthogonal directions parallel to the first dimension and the second dimension, respectively, in a plane parallel to the light-generating region, and the third dimension of the light emission port is greater than the fourth dimension thereof.

8. The laser of claim 1, wherein the first and second conductive mirror regions each include a distributed Bragg reflector.

9. The laser of claim 1, wherein the first and second conductive mirror regions each include alternating layers of AlAs and AlGaAs.

10. The laser of claim 1, wherein the reduced-conductivity region includes ion-implanted material.

11. The laser of claim 1, wherein the laser is one of an array of substantially identical lasers each emitting a light beam having a substantially identical direction of polarization, the array of substantially identical lasers being formed in a common layered structure, each one of the lasers in the array including an individual electrode, the reduced-conductivity region of the one of the lasers in the array functioning to isolate the one of the lasers from adjacent ones of the lasers in the array.

12. The laser of claim 11, wherein the array of substantially identical lasers is a two-dimensional array in the plane parallel to the light-generating region.

13. A scanning apparatus providing a uniform level of illumination along a scanning line, the scanning apparatus comprising:

a vertical-cavity surface-emitting laser emitting a light beam having a defined direction of polarization; and scanning means for angularly deflecting the light beam in a repetitive cycle to generate a scanning beam, the scanning means having a transfer function between the light beam and the scanning beam that has a variation according to the direction of polarization of the light beam, wherein:

the laser comprises:

a plane light-generating region sandwiched between a first conductive mirror region and a second conductive mirror region, the first conductive mirror region having an opposite electrical conductivity mode from the second conductive mirror region, the second conductive mirror region being doped with p-type impurities; and a substrate having a surface whereon the second conductive mirror region is formed, the substrate including n-type GaAs, with a degenerately-doped p-type layer at the surface and a degenerately-doped n-type layer thereunder, the degenerately-doped layers constituting a tunnel junction, the first conductive mirror region includes:

a remote surface substantially parallel to the light-generating region;

an electrode formed on the remote surface, the electrode including a light emission port from which the light is emitted in a direction defining an axis; and a reduced-conductivity region surrounding the axis and extending from the remote surface towards the light-emitting region to define a core region in the first conductive mirror region, the core region having a first dimension and a second dimension in orthogonal directions in a plane parallel to the light-generating region, the first dimension being greater than the second dimension to set the direction of polarization of the light to the direction of the first dimension, and the laser is aligned relative to the scanning means such that the direction of polarization of the light beam falling on the scanning means is in a range in which the variation of the transfer function of the scanning means is below a threshold value.

14. The scanning apparatus of claim 13, wherein the second dimension is less than 80% of the first dimension.

15. The scanning apparatus of claim 13, wherein the second dimension is between 60% and 30% of the first dimension.

16. The scanning apparatus of claim 13, wherein the core region is substantially elliptical in the plane parallel to the light-generating region.

17. The scanning apparatus of claim 13, wherein the core region is substantially rectangular in the plane parallel to the light-generating region.

18. The scanning apparatus of claim 13, wherein the laser is one of an array of substantially identical lasers each emitting a light beam having a substantially identical direction of polarization, the array of substantially identical lasers being formed in a common layered structure, each one of the lasers in the array including an individual electrode, the reduced-conductivity region of the one of the lasers functioning to isolate the one of the lasers from adjacent ones of the lasers of the array.

19. The scanning apparatus of claim 18, wherein the apparatus additionally comprises a photo conductive drum positioned to be scanned on adjacent scanning lines by scanning beams resulting from the scanning means angularly deflecting the light beam from each of the lasers in the array.

20. The scanning apparatus of claim 13, wherein the apparatus additionally comprises a photo conductive drum positioned to be scanned by the scanning beam.

21. An optical transmitter apparatus generating a light beam having a controlled intensity for feeding into an optical communication system, the optical transmitter apparatus comprising:
- a vertical-cavity surface-emitting laser emitting the light beam with a defined direction of polarization;
- means for coupling the light beam into the optical communication system; and
- feedback means for controlling the intensity of the light beam, the feedback means including sampling means for deriving a sample beam from the light beam, the sampling means having a transfer function between the light beam and the sampling beam that has a variation according to the direction of polarization of the light beam, wherein:
  - the laser comprises:
    - a plane light-generating region sandwiched between a first conductive mirror region and a second conductive mirror region, the first conductive mirror region having an opposite electrical conductivity mode from the second conductive mirror region, the second conductive mirror region being doped with p-type impurities; and
    - a substrate having a surface whereon the second conductive mirror region is formed, the substrate including n-type GaAs, with a degenerately-doped p-type layer at the surface and a degenerately-doped n-type layer thereunder, the degenerately-doped layers constituting a tunnel junction,
    - the first conductive mirror region includes:
      - a remote surface substantially parallel to the light-generating region;
      - an electrode formed on the remote surface, the electrode including a light emission port from which the light is emitted in a direction defining an axis; and
      - a reduced-conductivity region surrounding the axis and extending from the remote surface towards the light-emitting region to define a core region in the first conductive mirror region, the core region having a first dimension and a second dimension in orthogonal directions in a plane parallel to the light-generating region, the first dimension being greater than the second dimension to set the direction of polarization of the light to the direction of the first dimension.

22. The optical transmitter of claim 21, wherein the second dimension is less than 80% of the first dimension.

23. The optical transmitter of claim 21, wherein the second dimension is between 60% and 30% of the first dimension.

24. The optical transmitter of claim 21, wherein the core region is substantially elliptical in the plane parallel to the light-generating region.

25. The optical transmitter of claim 21, wherein the core region is substantially rectangular in the plane parallel to the light-generating region.

* * * * *